(12) United States Patent
Tsai et al.

(10) Patent No.: US 8,769,354 B2
(45) Date of Patent: Jul. 1, 2014

(54) MEMORY ARCHITECTURE AND ASSOCIATED SERIAL DIRECT ACCESS CIRCUIT

(75) Inventors: Yu-Hsiung Tsai, Hsinchu (TW); Po-Hao Huang, Hsinchu County (TW); Chiun-Chi Shen, Hsinchu County (TW); Jie-Hau Huang, Taichung (TW)

(73) Assignee: Ememory Technology Inc., Hsin-Chu (TW)

( * ) Notice: Subject to any disclaimer, the term of this patent is extended or adjusted under 35 U.S.C. 154(b) by 83 days.

(21) Appl. No.: 13/536,139

(22) Filed: Jun. 28, 2012

(65) Prior Publication Data

US 2014/0006885 A1    Jan. 2, 2014

(51) Int. Cl.
    *G11C 29/00*    (2006.01)
(52) U.S. Cl.
    USPC ......................................................... 714/718
(58) Field of Classification Search
    USPC ............ 714/718, 727, 724, 726, 729, 733, 37
    See application file for complete search history.

(56) References Cited

U.S. PATENT DOCUMENTS

| | | | |
|---|---|---|---|
| 4,433,413 A * | 2/1984 | Fasang | 714/732 |
| 5,568,437 A | 10/1996 | Jamal | |
| 5,581,564 A * | 12/1996 | Miller et al. | 714/726 |
| 5,805,794 A | 9/1998 | Jones et al. | |
| 5,974,500 A * | 10/1999 | Maletsky et al. | 711/103 |
| 6,321,320 B1 | 11/2001 | Fleischman et al. | |
| 6,430,718 B1 * | 8/2002 | Nayak | 714/727 |
| 6,456,961 B1 * | 9/2002 | Patil et al. | 703/14 |
| 7,031,866 B1 | 4/2006 | Behera et al. | |
| 7,093,091 B2 * | 8/2006 | DeCaro | 711/163 |
| 7,275,128 B2 * | 9/2007 | DeCaro | 711/103 |
| 7,397,717 B2 * | 7/2008 | Chen et al. | 365/221 |
| 7,793,031 B2 | 9/2010 | Sartori et al. | |
| 7,882,405 B2 | 2/2011 | Reggiori et al. | |
| 2002/0194558 A1 | 12/2002 | Wang et al. | |
| 2004/0002832 A1 * | 1/2004 | Chan | 702/120 |
| 2005/0146981 A1 | 7/2005 | Ahn | |

FOREIGN PATENT DOCUMENTS

| | | |
|---|---|---|
| JP | 6119508 | 4/1994 |
| JP | 2001319494 | 11/2001 |
| JP | 200493433 | 3/2004 |
| JP | 200495028 | 3/2004 |

OTHER PUBLICATIONS

European Patent Office, "Office Action", Feb. 11, 2013, Europe.
Japanese Patent Office, "Office Action", Aug. 15, 2013.
European Patent Office, "Office Action", Dec. 11, 2013.
Japan Patent Office, "Office Action", Dec. 19, 2013.

* cited by examiner

*Primary Examiner* — Fritz Alphonse
(74) *Attorney, Agent, or Firm* — WPAT, PC; Justin King

(57) ABSTRACT

The present invention provides a memory architecture and associated serial direct access (SDA) circuit. The memory architecture includes a memory of a parallel interface and a serial direct access (SDA) circuit. The SDA circuit includes an enable pin, a serial pin and an auto-test module. The enable pin receives an enable bit, wherein the SDA circuit is selectively enabled and disabled in response to the enable bit. When the SDA circuit is enabled, the serial pin sequentially relaying a plurality of serial bits, such that each of the serial bits is associated with one of parallel pins of the parallel interface; in addition, the auto-test module can perform a built-in test of the memory associated with the serial bits.

19 Claims, 7 Drawing Sheets

MEMORY ARCHITECTURE AND ASSOCIATED SERIAL DIRECT ACCESS CIRCUIT

FIELD OF THE INVENTION

The present invention relates to a memory architecture and associated serial direct access (SDA) circuit, and more particularly, to a memory architecture and associated SDA circuit providing serial access and built-in test functionality to support multi-die test.

BACKGROUND OF THE INVENTION

Integrated circuits formed on silicon dice have become one of the most import hardware foundations of modern technologies. In general, a die includes a plurality of circuit blocks, which are also known as silicon intellectual properties (IP's). For example, central processing units and micro control units are commonly adopted logic circuit blocks. Also, non-volatile and/or volatile embedded memories which can be integrated into a die have become essential circuit blocks in modern dice.

The circuit blocks of a die need to communicate with each other; for optimal efficiency of communication, each of the circuit blocks is equipped with a parallel interface of multiple pins coupled to other circuit block(s). For example, a parallel interface of a memory includes multiple address pins and multiple data pins; each of the address pins can simultaneously receive a portion (such as a binary bit) of an address, so a complete address for accessing the memory is obtained by collecting the portions respectively received by the address pins. For programming (writing) a data to the address of the memory, each data pin of the parallel interface simultaneously receives a portion (such as a binary bit) of the data, thus the complete data is gathered and programmed (written) into a memory location assigned by the address. To read a data from the address of the memory, each of the data pin simultaneously outputs a portion of the data, thus the complete data stored in the address is obtained and outputted through the parallel interface of the memory.

While a parallel interface of a circuit block enhances communication efficiency, it is difficult to perform function test for the circuit block through its parallel interface. Testers equipped with probing cards are used to test dice on silicon wafers; each probing card has multiple probes, each probe can contact to a pad of a die, such that signal and/or power can be fed into the die and/or received from the die. A probe can not contact to a pin unless the pin is connected to a pad, since a pin is merely an internal conduction path within a die for relaying and routing signal. That is, if a circuit block in a die is tested through parallel pins of the parallel interface, each of the parallel pins needs to be connected to an individual pad of the die. Arranging pads for pins of a parallel interface is very expensive, since each pad, e.g., a pad with electro-static discharge (ESD) protection, occupies a considerable layout area of a die. Furthermore, testing through parallel interface constrains efficiency of testing. Because a probing card only has a finite number of probes, more pads a die need to be probed, less dice can be simultaneously tested by a probing card.

SUMMARY OF THE INVENTION

Therefore, an objective of the invention is providing a memory architecture with a parallel interface, including a memory (an embedded flash memory, for example) and an SDA circuit. The memory includes a plurality of parallel pins of the parallel interface. The SDA circuit includes an enable pin, a serial pin and an auto-test module. The enable pin is arranged to receive an enable bit, wherein the SDA circuit is selectively enabled and disabled in response to the enable bit. The serial pin is arranged to sequentially relaying (inputting and/or outputting) a plurality of serial bits when the SDA circuit is enabled, such that each of the serial bits is associated with one of the parallel pins; for example, each serial bit can be inputted to an associated parallel pin, and/or each serial bit is outputted by an associated parallel pin. The auto-test module is arranged to perform a built-in test of the memory associated with the serial bits when the SDA circuit is enabled. For example, the auto-test module can perform the built-in test in response to the serial bits when the SDA circuit is enabled.

Because the parallel pins can be serially accessed through fewer pin(s) of the SDA circuit, efficiency for testing of the memory is improved. As a die has fewer pads to be probed, more dice can be tested by a single probing card. Thus, multi-die test is supported and optimized.

In an embodiment, the parallel pins includes a predetermined number of address pins, each of the address pins receives an address bit, and the address bits simultaneously received by the address pins form a first address for accessing the memory. When the auto-test module performs the built-in test, the auto-test module automatically updates the first address to provide a second address for accessing the memory.

In an embodiment, the built-in test is an auto-program test. The parallel pins further comprise a second predetermined number of data pins, each of the data pins receives a data bit, and the data bits simultaneously received by the data pins form a first data for the memory. When the auto-test module performs the built-in auto-program test, the auto-test module further automatically provides a second data in response to the first data. For example, the second data can be identical to the first data. Or, the auto-test module can perform a logic operation on the first data to obtain the second data, e.g., inverting each bit of the first data to obtain the second data. Hence, the auto-test module further programs (writes) the first data and the second data respectively to the first address and the second address of the memory.

That is, in response to only one serially inputted data to be programmed to a serially inputted address, the SDA circuit can automatically program more data to other address (or addresses) without further input of data and addresses. Thus, efficiency of testing is enhanced, since the tester, which operates much slower than the die under test, does not have to feed further addresses and more data to fill the memory.

In an embodiment, the built-in test is an auto-read test. When the auto-test module performs the built-in auto-read test, the auto-test module further reads a first data and a second data respectively from the first address and the second address of the memory, compares the first data and the second data with predetermined data to generate a comparison result, and outputs the comparison result via a second serial pin of the SDA circuit. In an embodiment, the serial pin and the second serial pin are commonly coupled to a same pad to share the pad.

That is, in response to only one serially inputted address to be read, the SDA circuit can automatically read more data from other address (or addresses) without further input of addresses. Thus, efficiency of testing is enhanced, since the tester does not have to feed further addresses to read other portion of the memory. In an embodiment, the SDA circuit can serially output the automatically read data to the tester to verify functions of the memory. In another embodiment, the SDA circuit automatically verifies (compares) if the read data match expected contents, and outputs the result to the tester via the second serial pin, thus efficiency of test is further improved, because the tester only needs to serially receive the verification (comparison) result, instead of all read data.

In an embodiment, the serial pin and the enable pin are respectively coupled to different pads.

An objective of the invention is providing an SDA circuit for a circuit block which includes a parallel interface of multiple parallel pins. The SDA circuit includes an enable pin, a serial pin and an auto-test module. The enable pin is arranged to receive an enable bit, wherein the SDA circuit is selectively enabled and disabled in response to the enable bit. The serial pin is arranged to sequentially relay a plurality of serial bits when the SDA circuit is enabled, such that each of the serial bits is associated with one of the parallel pins. The auto-test module is arranged to perform a built-in test of the circuit block associated with the serial bits. For example, the auto-test module can perform the built-in test in response to the serial bits when the SDA circuit is enabled.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
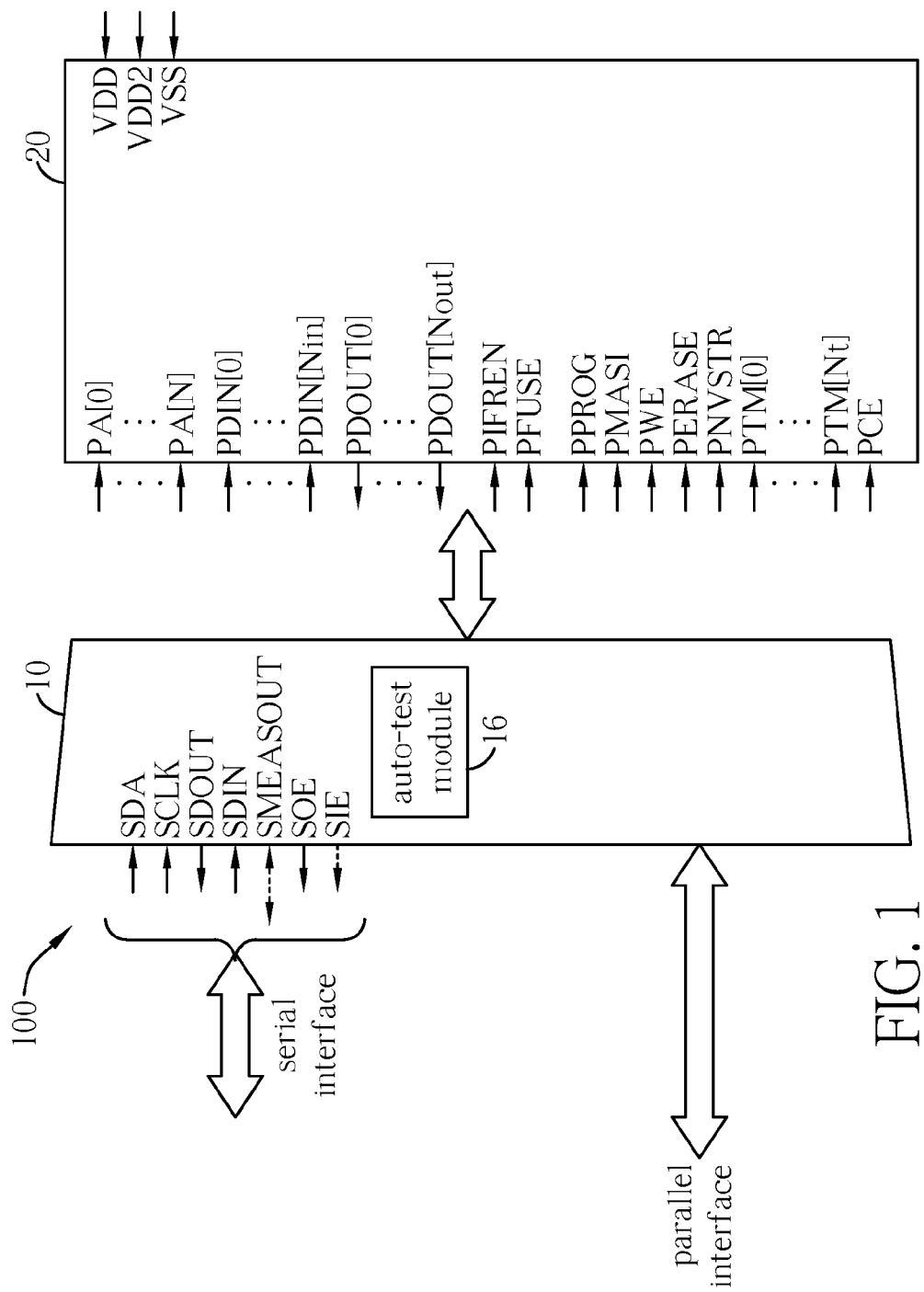
FIG. 1 illustrates a circuit block architecture according to an embodiment of the invention.

Please refer to FIG. 1 illustrating a circuit block architecture 100 according to an embodiment of the invention. The circuit block architecture 100 includes an SDA circuit 10 and a circuit block 20. In an embodiment, the circuit block 20 is a memory, e.g., a flash memory, thus the circuit block architecture 100 is a memory architecture. The circuit block 20 includes a plurality parallel pins for parallel control and access of the circuit block 20; for example, the circuit block 20 can include parallel address input pins PA[0] to PA[N], parallel pins PIFREN and PFUSE for further addressing, parallel data input pins PDIN[0] to PDIN[Nin], parallel data output pins PDOUT[0] to PDOUT[Nout], and some parallel control pins for receiving parallel control bits, such as pins PPROG, PMASI, PWE, PERASE, PNVSTR, PTM[0] to PTM[Nt] and PCE, etc. The circuit block 20 also obtains supply voltages from pins VDD, VDD2 and VSS. On the other hand, for serial controlling and access the circuit block 20, the SDA circuit 10 includes pins SDA, SCLK, SDOUT, SDIN, SOE and optional pins SMEASOUT and SIE.

For programming (inputting, writing, registering or storing) a data to an address of the circuit block 20, each of the parallel pins PA[0] to PA[N] simultaneously receives a portion (e.g., a binary address bit) of the address, so the complete address (e.g., an address of (N+1) bits) can be provided by collecting the portions received by the pins PA[0] to PA[N]. Also, each of the parallel pins PDIN[0] to PDIN[Nin] synchronously receives a portion (e.g., a binary data bit) of the data, so the data (e.g., data of (Nin+1) bits) can then be programmed into the address of the circuit block 20. In an embodiment, the circuit block 20 includes three blocks for storing data, e.g., a main block, an information block and a fuse block, and each of the pins PIFREN and PFUSE receives a binary bit to respectively indicate if the information block is enabled and if the fuse block is enable, i.e., whether the address belongs to the information block and whether the address belongs to the fuse block.

For reading (or receiving) data from an address of the circuit block 20, each of the parallel pins PA[0] to PA[N] simultaneously receives a portion of the address, hence the data of the address can be read. Accordingly, each of the parallel pins PDOUT[0] to PDOUT[Nout] synchronously outputs a portion (e.g., a binary data bit) of the data (e.g., data of (Nout+1) bits).

Each of the pins PPROG, PMASI, PERASE, PNVSTR and PCE simultaneously receives a status (e.g., a binary control bit) to respectively determine if programming is enabled, if chip erase is enabled, if erase is enabled, if non-volatile is enabled and if chip is enabled. The pin PWE is a pulse pin for program and erase. The pins PTM[0] to PTM[Nt] are test mode pins.

Besides a parallel interface of the parallel address pins (e.g., the pins PA[0] to PA[N]), the parallel data pins (e.g., the pins PDIN[0] to PDIN[Nin] and the pins PDOUT[0] to PDOUT[Nout]) and the parallel control pins (e.g., the pins PPROG, PMASI, PWE, PERASE, PNVSTR, PTM[0] to PTM[Nt] and PCE, etc), the SDA circuit 10 implements a serial interface for testing the circuit block 20. The serial interface includes the pins SDA, SCLK, SDIN, SDOUT and SOE, and the optional pins SMEASOUT and SIE. The pin SDA is an enable pin for receiving an enable bit, so the SDA circuit 10 is selectively enabled and disabled in response to the enable bit. When the SDA circuit 10 is disabled, the circuit block 20 performs normal functions and communicates with other circuit block(s) (not shown) through the parallel interface. When the SDA circuit 10 is enabled, the circuit block architecture 100 enters a test mode, the circuit block 20 is thus under test of a tester, and is controlled and accessed through the serial interface of the SDA circuit 10.

When the SDA circuit 10 is enabled, portions of an address are sequentially received by the pin SDIN, and then respectively dispatched to the parallel address pins PA[0] to PA[N]. The pin SDIN, as a serial input pin, also serially receives portions of a data of an address, so the data can be programmed into the circuit block 20 via the parallel pins PDIN[0] to PDIN[Nin]. On the other hand, the pin SDOUT is a serial output pins, sequentially outputs portions of a data read from the pins PDOUT[0] to PDOUT[Nout] of the circuit block 20. The pin SCLK receives a clock of serial access while the SDA circuit 10 is enabled.

When the SDA circuit 10 is enabled, each of the pins SOE and SIE outputs a status (e.g., a binary bit) to respectively indicate if data output is enabled and if data input is enabled. Because data input and data output are mutually exclusive for serial access, the pin SIE can be omitted, and the pins SDIN and SDOUT can share a pad IO_PAD (not shown in FIG. 1); the pin SOE can also be attached to the pad IO_PAD to indicate whether the pad IO_PAD is inputting for the pin SDIN or outputting for the pin SDOUT. The pin SMEASOUT is a bi-directional pin for analog input and output;

when the circuit block 20 is under test, current of the circuit block 20 can be measured through the pin SMEASOUT. If such analog measurement is not required, the pin SMEA-SOUT can be omitted.

In an embodiment, the pin SDA occupies an individual pad which is not shared with other pins. However, all the rest pins of the serial interface can share pads with other pins which are not used when the SDA circuit 10 is enabled. With such arrangement, number of pads for a die to be probed by the tester can be minimized, and number of dice tested by a same probing card can be maximized. The pad for the pin SDA can be weakly tied to a level which disables the SDA circuit 10, and then driven to another level to enable the SDA circuit 10. Or, the pad for the pin SDA can be controlled by bounding option.

In addition to receiving external serial control and access (e.g., from the tester) via the serial interface, the SDA circuit 10 also includes an auto-test module 16 to perform built-in tests, e.g., an auto-program test and an auto-read test, when the SDA circuit 10 is enabled. For the auto-program test, the SDA circuit 10 receives, from the tester, a start-up address and a start-up data for the start-up address via the serial interface.

In addition to programming the start-up data to the start-up address of the circuit block 20, the auto-test module 16 also automatically updates the start-up address to provide a serial of subsequent addresses for accessing the circuit block 20. In response to the start-up data, the auto-test module further automatically provides a serial of subsequent data for the subsequent addresses, such that these subsequent data are respectively programmed into the subsequent addresses of the circuit block 20. That is, in response to only one serially inputted data and one serially inputted address, the SDA circuit 10 can automatically program more data to other addresses without further input of data and addresses. Thus, efficiency of testing is enhanced, since the tester does not have to feed more addresses and more data to fill the addresses of the circuit block 20.

In an embodiment of the auto-program test, the subsequent data automatically generated can be identical to the star-up data received from the tester. Or, the auto-test module 16 can perform a logic operation on a previous data to obtain a consecutive data, e.g., inverting each bit of the previous data to obtain a complementary data as the consecutive data, and thus forming a series of data with a chessboard pattern. In an embodiment, the auto-test module 16 provides a series of addresses ranging from the start-up address to the last address of the circuit block 20, and thus the addresses from the start-up address to the last address are programmed. In an embodiment, the auto-test module 16 provides a series of addresses which starts from the start-up address to the last address of the circuit block 20, and rolls back from the last address till the start-up address; therefore all the addresses of the circuit block 20 can be programmed.

For the auto-read test, the SDA circuit 10 receives a start-up address from the tester via the serial interface. In addition to read a data from the start-up address of the circuit block 20, the auto-test module 16 also automatically updates the start-up address to provide a serial of subsequent addresses for accessing the circuit block 20, such that a series of subsequent data is read from the subsequent addresses of the circuit block 20. That is, in response to only one serially inputted address, the SDA circuit 10 can automatically read more data from other addresses without further input of addresses. Efficiency of testing is therefore enhanced, because the tester does not have to feed more addresses.

In an embodiment of the auto-read test, the SDA circuit 10 can serially output the series of automatically read data to the tester to verify functions of the circuit block 20. In another embodiment of the auto-read test, the auto-test module 16 of the SDA circuit 10 automatically verifies (compares) if the read data match expected contents and outputs the result to the tester via the serial interface, thus efficiency of test is further improved, because the tester only needs to serially receive the verification (comparison) result instead of all read data.

Figure 2:
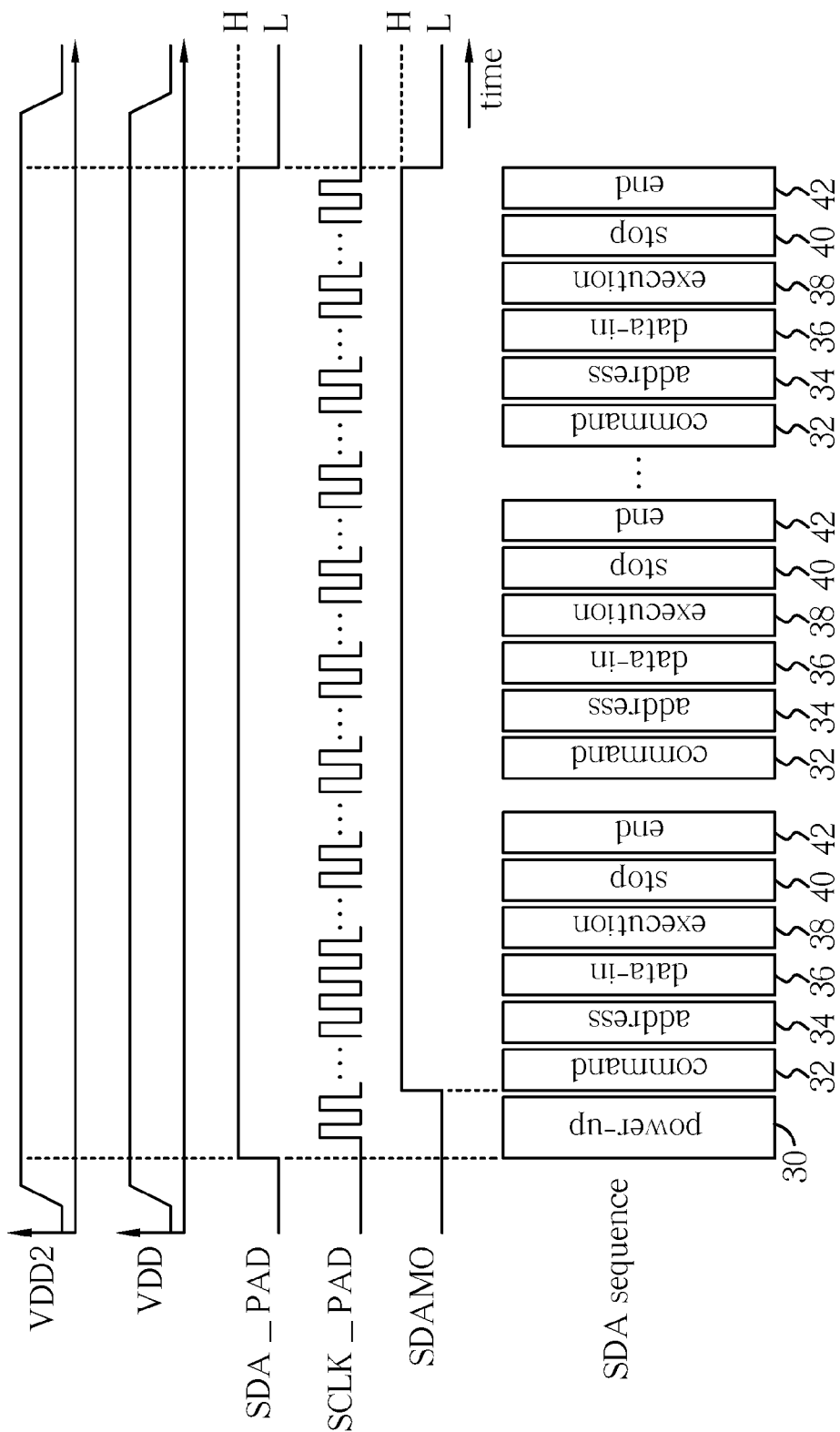
FIG. 2 illustrates a sequence of stages for testing the circuit block shown in FIG. 1 according to an embodiment of the invention.

Please refer to FIG. 2 illustrating operation of the SDA circuit 10 according to an embodiment of the invention. Testing of the circuit block 20 can be accomplished by states 30, 32, 34, 36, 38, 40 and 42, respectively being a power-up state, a command state, an address state, a data-in state, an execution state, a stop state and an end state. To start testing, proper supply voltages are built-up to the pins VDD and VDD2. After the supply voltages are stable, a signal of a pad SDA_PAD is driven from a level L to a level H, thus the pin SDA, coupled to the pad SDA_PAD, receives a bit to enable the SDA circuit 10. After the SDA circuit 10 is enabled, the circuit block architecture 100 enters the power-up state 30 to prepare the circuit block 20 for accessing and testing. While the power-up state 30 ends, testing can be performed by one or more rounds of states 32, 34, 36, 38, 40 and 42; during each round of the states 32 to 42, an internal signal SDAMO of the SDA circuit 10 is kept at the level H, and a pad SCLK_PAD coupled to the pin SCLK is toggled. After the test completes, the signal of the pad SDA_PAD is transited back to the level L, the signal SDAMO transits back to the level L, and the SDA circuit 10 is thus disabled. Following complete disable of the SDA circuit 10, the voltages supplied to the pins VDD and VDD2 can be lowered to power down the SDA circuit 10 for power saving.

Figure 3:
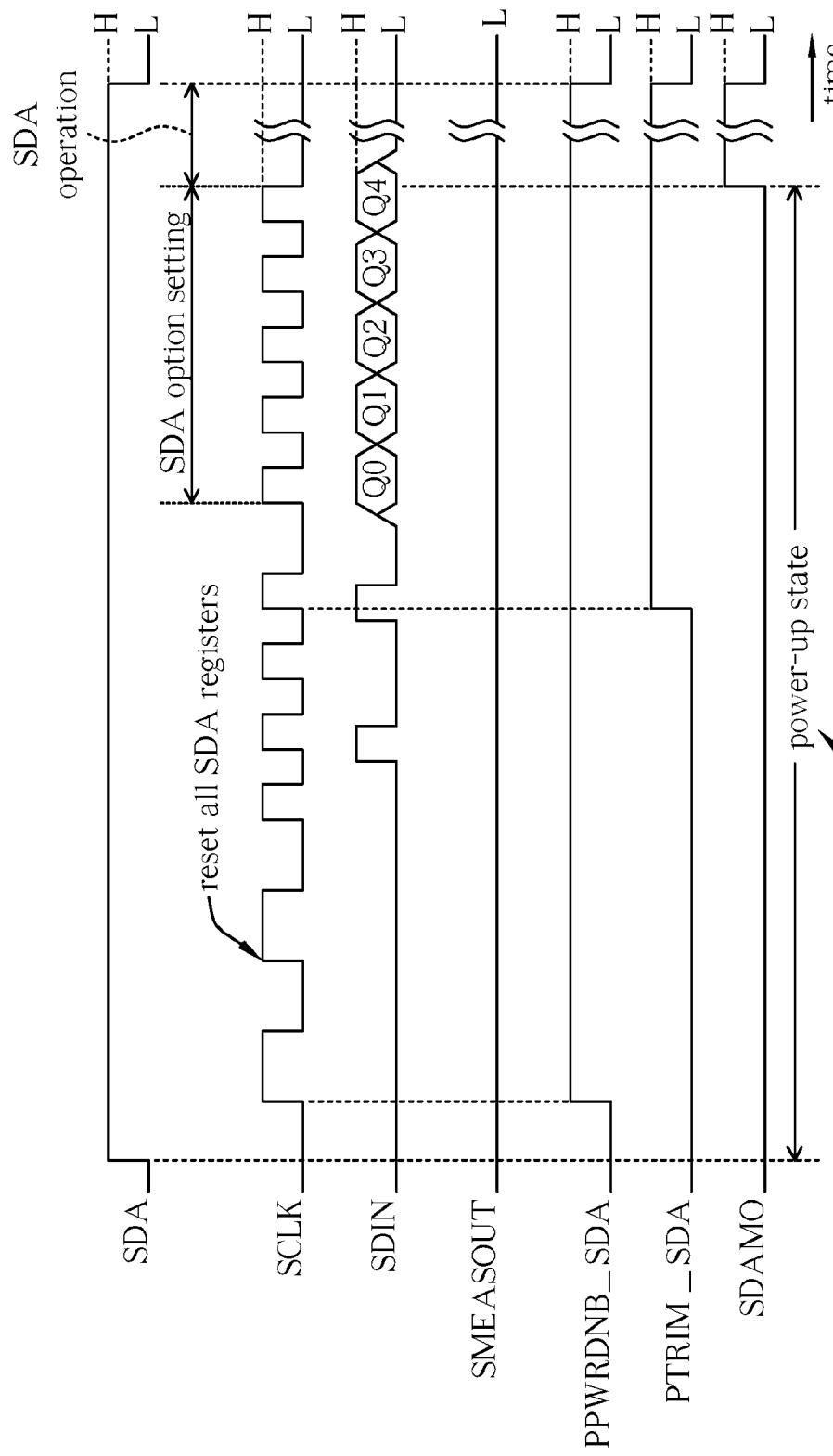
FIG. 3 to FIG. 7 respectively illustrate stages shown in FIG. 2.

Please refer to FIG. 3 illustrating the power-up state 30 according to an embodiment of the invention. The SDA circuit 10 operates in the power-up state 30 between an L-to-H transition of the pin SDA and an L-to-H transition of the signal SDAMO. During the power-up state 30, a signal PPWRDNB_SDA transits from the level L to the level H to disable power-down mode of the circuit block 20, and later a signal PTRIM_SDA also transits from the level L to the level H to enable trimming of the circuit block 20. The signals PPWRDNB_SDA and PTRIM_SDA are kept at the level H until end of testing, i.e., an H-to-L transition of the pin SDA. The pin SMEASOUT is kept at the level L throughout the power-up state 30.

While the pin SCLK is toggled during the power-up state 30, its second L-to-H transition after enable of the pin SDA triggers the SDA circuit 10 to reset all its registers. Via the pin SDIN, the tester can use two pulses (dummy cycles) to inform the SDA circuit 10 that there are incoming information, and several statuses, such as binary setting bits Q0, Q1, Q2, Q3 and Q4, are then sent to the SDA circuit 10 via the pin SDIN; these statuses are used to specify SDA option setting which controls how testing is performed. For example, the bit Q0 selects how program addresses are automatically updated (incremented), the bit Q1 selects whether the series of data automatically provided during auto-program is generated by logic operation of inversion, the bit Q2 selects whether the auto-test module 16 performs data comparison during auto-read test, the bit Q3 determines whether the built-in test is auto-program or auto-read, and the bit Q4 selects how many bits (e.g., 8 bits or 32 bits) of data are accessed during test. After the L-to-H transition of the signal SDAMO, the circuit block 20 is ready for accessing, and the SDA circuit 10 continues to SDA operation, i.e., round(s) of the states 32 to 42.

Figure 4:
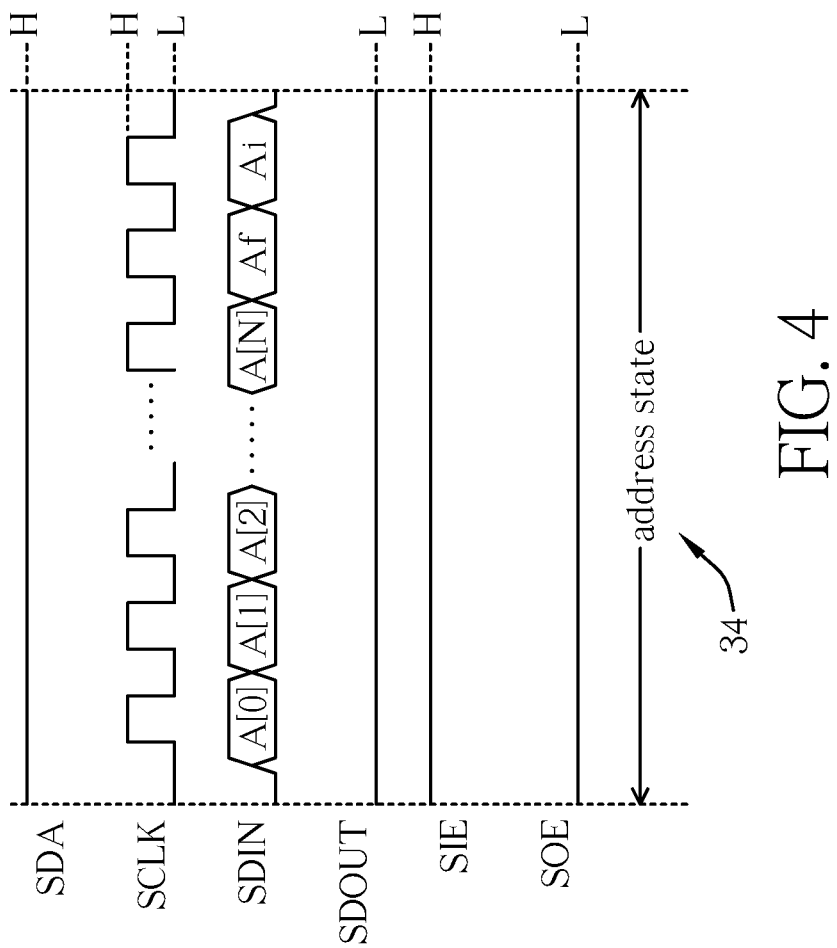
Figure 5:
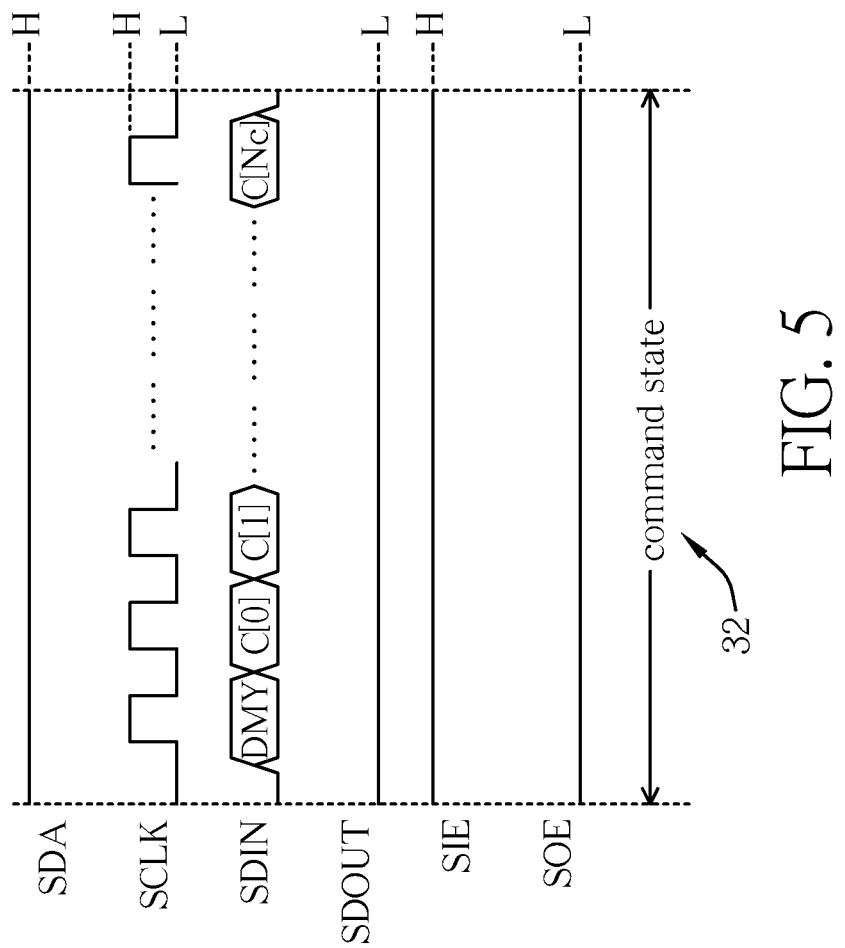
Figure 6:
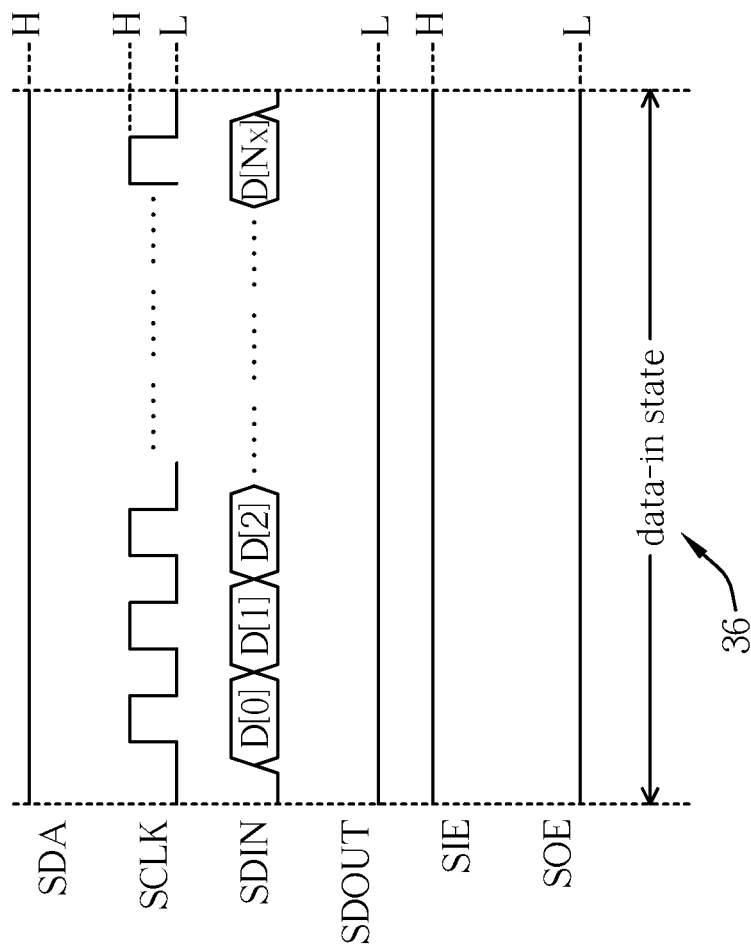

Please refer to FIG. 4, FIG. 5 and FIG. 6 respectively illustrating the address state 34, the command state 32 and the data-in state 36. As shown in FIG. 4, during the address state 34, address bits A[0] to A[N] to form a complete address of the circuit block 20 can be sequentially received by the pin SDIN on toggling of the pin SCLK, so the bits A[0] to A[N] can be respectively fed to the pins PA[0] to PA[N] (FIG. 1). Two more bits Af and Ai are also received via the pin SDIN following two consecutive pulses received by the pin SCLK, and are respectively fed to the pins PFUSE and PIFREN (FIG. 1) by the SDA circuit 10. During the address state 34, the pin SDA is kept at the level H by the tester, the pins SDOUT, SIE and SOE are respectively kept at the levels L, H and L by the SDA circuit 10, and the pin SMEASOUT is kept at high impedance.

As illustrated by FIG. 5, during the command state 32, bits such as a dummy bit DMY and control bits C[0] to C[Nc] can be sequentially received by the pin SDIN in response to cycles of the pin SCLK, so the control bits C[0] to C[Nc] can be respectively fed to, for example, the pins PPROG, PMASI, PWE, PERASE, PNVSTR, PTM[0] to PTM[Nt] and PCE (FIG. 1). During the command state 32, the pin SDA is kept at the level H, the pins SDOUT, SIE and SOE are respectively kept at the levels L, H and L, and the pin SMEASOUT remains high impedance.

As depicted in FIG. 6, during the data-in state 36, each of data bits D[0] to D[Nx] can be serially received by the pin SDIN in response to a toggling cycle of the pin SCLK, so the data bits D[0] to D[Nx] can be respectively fed to the pins PDIN[0] to PDIN[Nin] (FIG. 1), wherein the quantity Nx is less than or equal to the quantity Nin, and the value of the quantity Nx is dependent on the bit Q4 of the power-up state 30 (FIG. 3). During the data-in state 36, the pin SDA is kept at the level H, the pins SDOUT, SIE and SOE are respectively kept at the levels L, H and L, and the pin SMEASOUT remains high impedance.

During the execution state 38, the pin SCLK is kept toggling, so the circuit block 20 can execute command specified by the control bits C[0] to C[Nc] (FIG. 5), and/or, the auto-test module 16 can be triggered to automatically perform built-in test selected and set according to the SDA option setting of the setting bits Q0 to Q4 (FIG. 3). The result of the executed command and/or the performed built-in test can then be outputted by the SDA circuit 10 during a data-out state 35. Please refer to FIG. 7 illustrating the data-out state 35, the stop state 40 and the end state 42.

Figure 7:
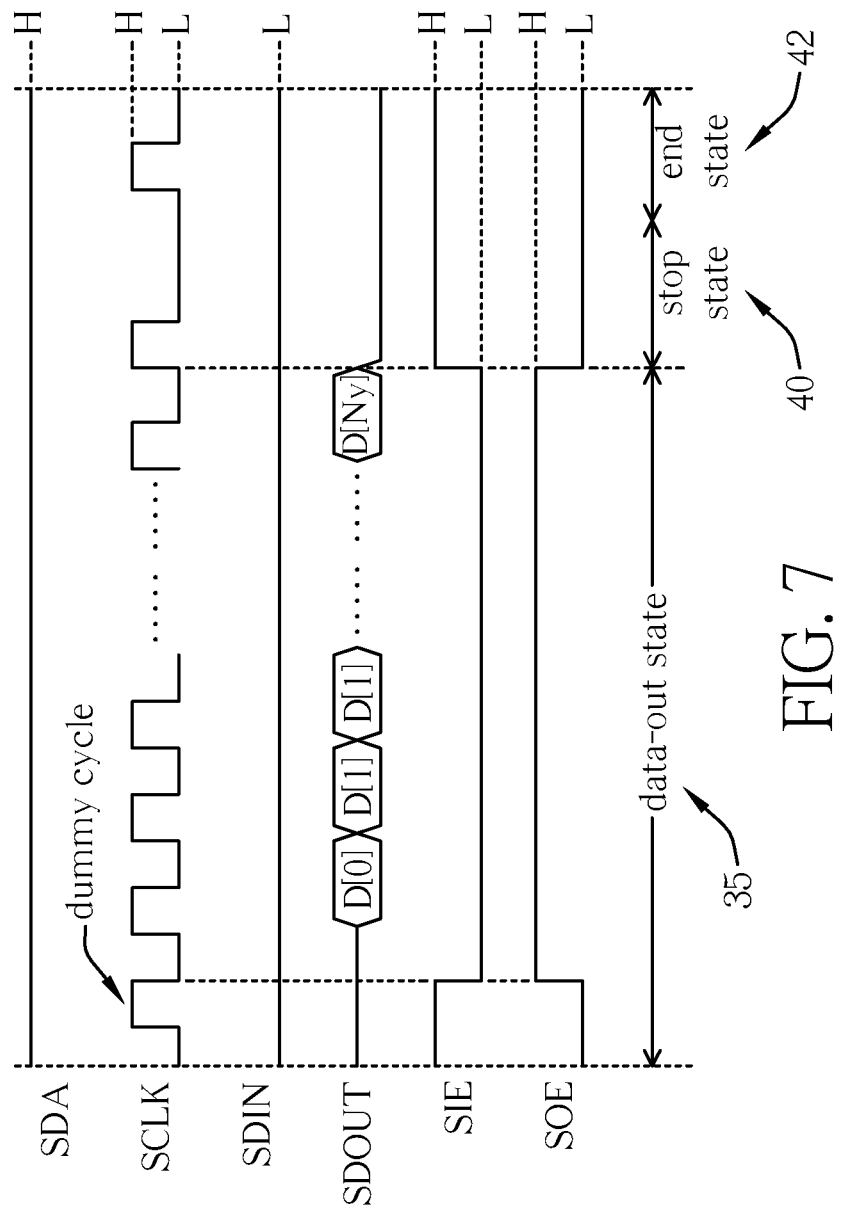

As shown in FIG. 7, during the data-out state 35, the pins SIE is transited from the level H to the level L after a dummy cycle of the pin SCLK, and the pin SOE is synchronously transited from the level L to the level H, so the tester is informed that the SDA circuit 10 will send output information. After the dummy cycle of the pin SCLK, output bits D[0] to D[Ny] can then be sequentially outputted via the pin SDOUT in response to subsequent cycles received by the pin SCLK. After complete transmission of the bits D[0] to D[Ny], the SDA circuit 10 transits the pins SIE from the level L to the level H, also transits the pin SOE from the level H to the level L, thus the data-out state 35 ends. Then, the tester sends a predetermined number of dummy cycles (e.g., two dummy cycles as shown in FIG. 7) via the pin SCLK during the stop state 40 and the end state 42 to ensure that a complete round of the states 32 to 42 is finished. During the data-out state 35, the stop state 40 and the end state 42, the pin SDA is kept at the level H, and the pin SMEASOUT remains high impedance.

In an embodiment, the output bits D[0] to D[Ny] serially transmitted by the SDA circuit 10 can be the automatically read data, so the tester can verify functions of the circuit block 20 by comparing if the read data match expected contents. In another embodiment, the SDA circuit 10 automatically verifies (compares) if the read data match expected contents, and outputs the verification (comparison) result to the tester by the serial output bits D[0] to D[Ny] of the pin SDOUT.

To sum up, during test of a circuit block, the invention provides a serial direct access to the circuit block with pads fewer than pins of a parallel access, thus multi-die testing can be supported and optimized. The invention also embeds automatic built-in test functionality along with the serial direct access, so efficiency of testing can be further improved.

While the invention has been described in terms of what is presently considered to be the most practical and preferred embodiments, it is to be understood that the invention needs not be limited to the disclosed embodiment. On the contrary, it is intended to cover various modifications and similar arrangements included within the principle and scope of the appended claims which are to be accorded with the broadest interpretation so as to encompass all such modifications and similar structures.

What is claimed is:

1. A memory architecture with a parallel interface and a serial interface which is used only during testing, comprising:
   a serial direct access (SDA) circuit comprising:
      a first set of parallel pins for parallel interface operation;
      an enable pin for receiving an enable bit, wherein the SDA circuit is enabled when the enable bit equals a first logic value, and is disabled when the enable bit equals a second logic value;
      a second set of parallel pins outputted from the SDA circuit, wherein the second set of parallel pins is arranged to relay the first set of parallel pins when the enable bit equals the second logic value;
      a serial pin for sequentially relaying a plurality of serial bits when the SDA circuit is enabled, such that each of the serial bits is associated with one of the second set of parallel pins; and
      an auto-test module for at least one of the following:
         performing a built-in test of the memory instructed by the serial bits when the SDA circuit is enabled, and reporting result the built-in test by the serial bits when the SDA circuit is enabled; and
   a memory comprising a plurality of parallel pins respectively coupled to the second set of parallel pins.

2. The memory architecture of claim 1, wherein the parallel pins of the memory comprise a predetermined number of address pins, each of the address pins receives an address bit, and the address bits simultaneously received by the address pins form a first address for accessing the memory; when the auto-test module performs the built-in test, the auto-test module automatically updates the first address to provide a second address for accessing the memory.

3. The memory architecture of claim 2, wherein the parallel pins of the memory further comprise a second predetermined number of data pins, each of the data pins receives a data bit, and the data bits simultaneously received by the data pins form a first data for the memory; when the auto-test module performs the built-in test, the auto-test module further automatically provides a second data in response to the first data.

4. The memory architecture of claim 3, wherein when the auto-test module performs the built-in test, the auto-test module further programs the second data to the second address of the memory.

5. The memory architecture of claim 3, wherein when the auto-test provides the second data, the auto-test module performs a logic operation on the first data to obtain the second data.

6. The memory architecture of claim 3, wherein when the auto-test provides the second data, the second data is identical to the first data.

7. The memory architecture of claim 2, wherein when the auto-test module performs the built-in test, the auto-test module further reads a second data from the second address of the memory.

8. The memory architecture of claim 7, wherein the SDA circuit further comprises a second serial pin; when the auto-test module performs the built-in test, the auto-test module further compares the second data with a predetermined data to generate a comparison result, and outputs the comparison result via the second serial pin.

9. The memory architecture of claim 8, wherein the serial pin and the second serial pin are coupled to a same pad.

10. The memory architecture of claim 1, wherein the serial pin and the enable pin are respectively coupled to different pads.

11. A serial direct access (SDA) circuit for a circuit block which comprises a plurality of parallel pins, comprising:
   a first set of parallel pins for parallel interface operation, wherein the first set of parallel pins are respectively coupled to the plurality parallel pins of the circuit block;
   an enable pin for receiving an enable bit, wherein the SDA circuit is enabled when the enable bit equals a first logic value, and is disabled when the enable bit equals a second logic value;
   a second set of parallel pins outputted from the SDA circuit, wherein the second set of parallel pins is arranged to relay the first set of parallel pins when the enable bit equals the second logic value;
   a serial pin for sequentially relaying a plurality of serial bits when the SDA circuit is enabled, such that each of the serial bits is associated with one of the second set of parallel pins; and
   an auto-test module for performing a built-in test of the circuit block instructed by the serial bits when the SDA circuit is enabled.

12. The SDA circuit of claim 11, wherein the parallel pins of the circuit block comprise a predetermined number of address pins, each of the address pins receives an address bit, and the address bits simultaneously received by the address pins form a first address for accessing the circuit block; when the auto-test module performs the built-in test, the auto-test module automatically updates the first address to provide a second address for accessing the circuit block.

13. The SDA circuit of claim 12, wherein the parallel pins of the circuit block comprise a second predetermined number of data pins, each of the data pins receives a data bit, and the data bits simultaneously received by the data pins form a first data for the circuit block; when the auto-test module performs the built-in test, the auto-test module further automatically provides a second data in response to the first data.

14. The SDA circuit of claim 13, wherein when the auto-test module performs the built-in test, the auto-test module further inputs the second data to the second address of the circuit block.

15. The SDA circuit of claim 14, wherein when the auto-test provides the second data, the auto-test module performs a logic operation on the first data to obtain the second data.

16. The SDA circuit of claim 12, wherein when the auto-test module performs the built-in test, the auto-test module further receives a second data from the second address of the circuit block.

17. The SDA circuit of claim 16, wherein the SDA circuit further comprises a second serial pin; when the auto-test module performs the built-in test, the auto-test module further compares the second data with a predetermined data to generate a comparison result, and outputs the comparison result via the second serial pin.

18. The SDA circuit of claim 17, wherein the serial pin and the second serial pin are coupled to a same pad.

19. The SDA circuit of claim 11, wherein the serial pin and the enable pin are respectively coupled to different pads.

* * * * *